United States Patent
Kabasawa (10) Patent No.: US 7,446,527 B2
(45) Date of Patent: Nov. 4, 2008

(54) METHODS AND APPARATUS FOR REDUCING ARTIFACTS IN MRI IMAGES

(75) Inventor: Hiroyuki Kabasawa, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/679,708

(22) Filed: Feb. 27, 2007

(65) Prior Publication Data

US 2007/0210794 A1    Sep. 13, 2007

(30) Foreign Application Priority Data

Mar. 8, 2006   (JP) .............................. 2006-063135

(51) Int. Cl.
*G01V 3/00* (2006.01)
(52) U.S. Cl. ..................................... 324/309
(58) Field of Classification Search ......... 324/300–322; 600/410–435; 702/19, 22, 32, 57–80, 189–199
See application file for complete search history.

(56) References Cited

U.S. PATENT DOCUMENTS

2006/0106299 A1* 5/2006 Uchizono et al. ........... 600/410
2007/0299332 A1* 12/2007 Ikeda ......................... 600/410

FOREIGN PATENT DOCUMENTS

JP      2005-177240          7/2005
JP      2005237703 A   *   9/2005

OTHER PUBLICATIONS

Jinghua Wang et al.; "In Vivo Method for Correcting Transmit/Receive Nonuniformities with Phased Array Coils"; http://www3.interscience.wiley.com; Abstract; 2005; 1 pg.
Hiroaki Mihara et al.; "A Method of RF Inhomogeneity Correction in MR Imaging"; http://www.sciencedirect.com; Abstract; Jan. 7, 1998; 2 pg.

\* cited by examiner

*Primary Examiner*—Dixomara Vargas
(74) *Attorney, Agent, or Firm*—Armstrong Teasdale LLP (57) ABSTRACT

With the object of enhancing image quality, a transmission sensitivity distribution calculating part calculates a transmission sensitivity distribution by a double flip angle method. Next, a threshold processing part threshold-processes the calculated transmission sensitivity distribution. Further, an image correcting unit corrects an actual scan image using the transmission sensitivity distribution subsequent to the threshold processing.

20 Claims, 6 Drawing Sheets

METHODS AND APPARATUS FOR REDUCING ARTIFACTS IN MRI IMAGES

CROSS REFERENCE TO RELATED APPLICATIONS

This application claims the benefit of Japanese Application No. 2006-063135 filed Mar. 8, 2006.

BACKGROUND OF THE INVENTION

The present invention relates to a magnetic resonance imaging apparatus and a magnetic resonance imaging method, and particularly to a magnetic resonance imaging method and a magnetic resonance imaging method each of which executes an actual scan for allowing an RF coil unit to transmit an RF pulse to an imaging area of a subject in a static magnetic field space and to receive a magnetic resonance signal generated in the imaging area to which the RF pulse is transmitted, and thereafter generates an actual scan image about the imaging area, based on the magnetic resonance signal obtained by the execution of the actual scan.

A magnetic resonance imaging (MRI: Magnetic Resonance Imaging) apparatus has frequently been used particularly in medical applications as an apparatus which photographs an image about a tomographic plane of a subject through the use of a nuclear magnetic resonance (NMR: Nuclear Magnetic Resonance) phenomenon.

In the magnetic resonance imaging apparatus, a subject is accommodated in a static magnetic field space to align spins of proton of the subject in a static magnetic field direction, thereby generating magnetization vectors. Then, an RF pulse having a resonant frequency is applied to generate a nuclear magnetic resonance phenomenon, thereby changing the magnetization vectors of the proton. Thereafter, the magnetic resonance imaging apparatus receives a magnetic resonance (MR) signal generated when the proton is returned to its original magnetization vector state, and generates a tomographic image about a tomographic plane of the subject, based on the received magnetic resonance signal.

As an RF receiving coil for receiving the magnetic resonance signal in the magnetic resonance imaging apparatus, a surface coil such as a phased array coil or the like is frequently used. However, the surface coil has such a characteristic that receiving sensitivity is reduced with distance from a source of generation of the magnetic resonance signal in the subject. A sensitivity distribution in the entire imaging area is not uniform spatially. Therefore, there is a case in which artifacts occur in a tomographic image generated using the magnetic resonance signal received by the surface coil, thereby degrading the quality thereof.

Therefore, the tomographic image is correction-processed using a reception sensitivity distribution in order to cope with a problem or trouble caused by reception-sensitivity non-uniformity of such a surface coil. Described specifically, a reference image is acquired by executing a reference scan in addition to an actual scan, and a reception sensitivity distribution in an imaging area of the surface coil is measured using the reference image. Thereafter, a tomographic image generated by the actual scan is corrected using the measured reception sensitivity distribution (refer to, for example, a patent document 1).

There is however, for example, a case in which since a high frequency magnetic field formed by transmitting an RF pulse by means of an RF transmitting coil such as a body coil might be ununiform due to a dielectric constant effect upon imaging a subject in a high static magnetic field space having a magnetic field strength of 3 Tesla or higher, the removal of artifacts cannot be attained adequately even when the tomographic image is corrected using the above reception sensitivity distribution. That is, there is a case in which it is difficult to improve image quality due to the fact that a transmission sensitivity distribution is spatially ununiform.

Thus, a transmission sensitivity distribution is measured and the tomographic image is corrected using the measured transmission sensitivity distribution. The transmission sensitivity distribution is measured by, for example, a Double flip angle method. Described specifically, a plurality of reference scans are executed at flip angles different from one another. A transmission sensitivity distribution is measured using reference images obtained by the respective reference scans. Thereafter, a tomographic image acquired by an actual scan is correction-processed based on the transmission sensitivity distribution, thereby suppressing the occurrence of artifacts (refer to, for example, a non-patent document 1 and a non-patent document 2).

[Patent Document 1] Japanese Unexamined Patent Publication No. 2005-177240

[Non-Patent Document 1] Hiroaki Mihara et. al., A method of RF inhomogeneity correction in MR imaging, Magnetic Resonance Materials in Physics, Biology and Medicine 7, USA., 1998, p. 115-120

[Non-Patent Document 2] Jinghua Wang et. al., In vivo method for correcting transmit/receive nonuniformities with phased array coils, Magnetic Resonance in Medicine 53, USA., 2005, p. 666-674

Using the reception sensitivity distribution and the transmission sensitivity distribution in this way, the tomographic image obtained by the actual scan is corrected to enhance the quality thereof.

However, the transmission sensitivity distribution might cause an error due to influences such as susceptibility artifacts and the difference in T1 value between tissues. In particular, the transmission sensitivity distribution depends upon explicit flip angles. Since the gain increases with a decrease in flip angle, the error becomes larger. That is, the transmission sensitivity distribution measured in the above-described manner contains a portion low in accuracy. Therefore, when correction processing is made using such a transmission sensitivity distribution, an artifact might additionally occur in an image. Thus, there was a case in which an improvement in image quality was difficult.

SUMMARY OF THE INVENTION

Therefore, an object of the present invention is to provide a magnetic resonance imaging apparatus and a magnetic resonance imaging method capable of enhancing image quality.

In order to attain the above object, there is provided a magnetic resonance imaging apparatus of the present invention, which executes an actual scan for allowing an RF coil unit to transmit an RF pulse to an imaging area of a subject in a static magnetic field space and to receive a magnetic resonance signal generated in the imaging area to which the RF pulse is transmitted and which thereafter generates an actual scan image about the imaging area, based on the magnetic resonance signal acquired by the execution of the actual scan, the magnetic resonance imaging apparatus comprising an image correcting unit which corrects the actual scan image, wherein the image correcting unit includes a transmission sensitivity distribution calculating part which calculates a transmission sensitivity distribution at the time that the RF coil unit transmits the RF pulse, in the imaging area, and a threshold processing part which threshold-processes the transmission sensitivity distribution calculated by the transmission sensitivity distribution calculating part, and wherein the actual scan image is corrected using the transmission sensitivity distribution threshold-processed by the threshold processing part.

In order to attain the above object, there is provided a magnetic resonance imaging method according to the present invention, for executing an actual scan for allowing an RF coil unit to transmit an RF pulse to an imaging area of a subject in a static magnetic field space and to receive a magnetic resonance signal generated in the imaging area to which the RF pulse is transmitted, and thereafter generating an actual scan image about the imaging area, based on the magnetic resonance signal acquired by the execution of the actual scan, the magnetic resonance imaging method comprising an image correcting step for correcting the actual scan image, wherein the image correcting step includes a transmission sensitivity distribution calculating step for calculating a transmission sensitivity distribution at the time that the RF coil unit transmits the RF pulse, in the imaging area, and a threshold processing step for threshold-processing the transmission sensitivity distribution calculated by the transmission sensitivity distribution calculating step, and wherein the actual scan image is corrected using the transmission sensitivity distribution threshold-processed by the threshold processing step.

According to the present invention as described above, there can be provided a magnetic resonance imaging apparatus and a magnetic resonance imaging method capable of enhancing image quality.

Further objects and advantages of the present invention will be apparent from the following description of the preferred embodiments of the invention as illustrated in the accompanying drawings.

DETAILED DESCRIPTION OF THE INVENTION

One example illustrative of an embodiment according to the present invention will hereinafter be explained with reference to the accompanying drawings.

(Apparatus Construction)

Figure 1:
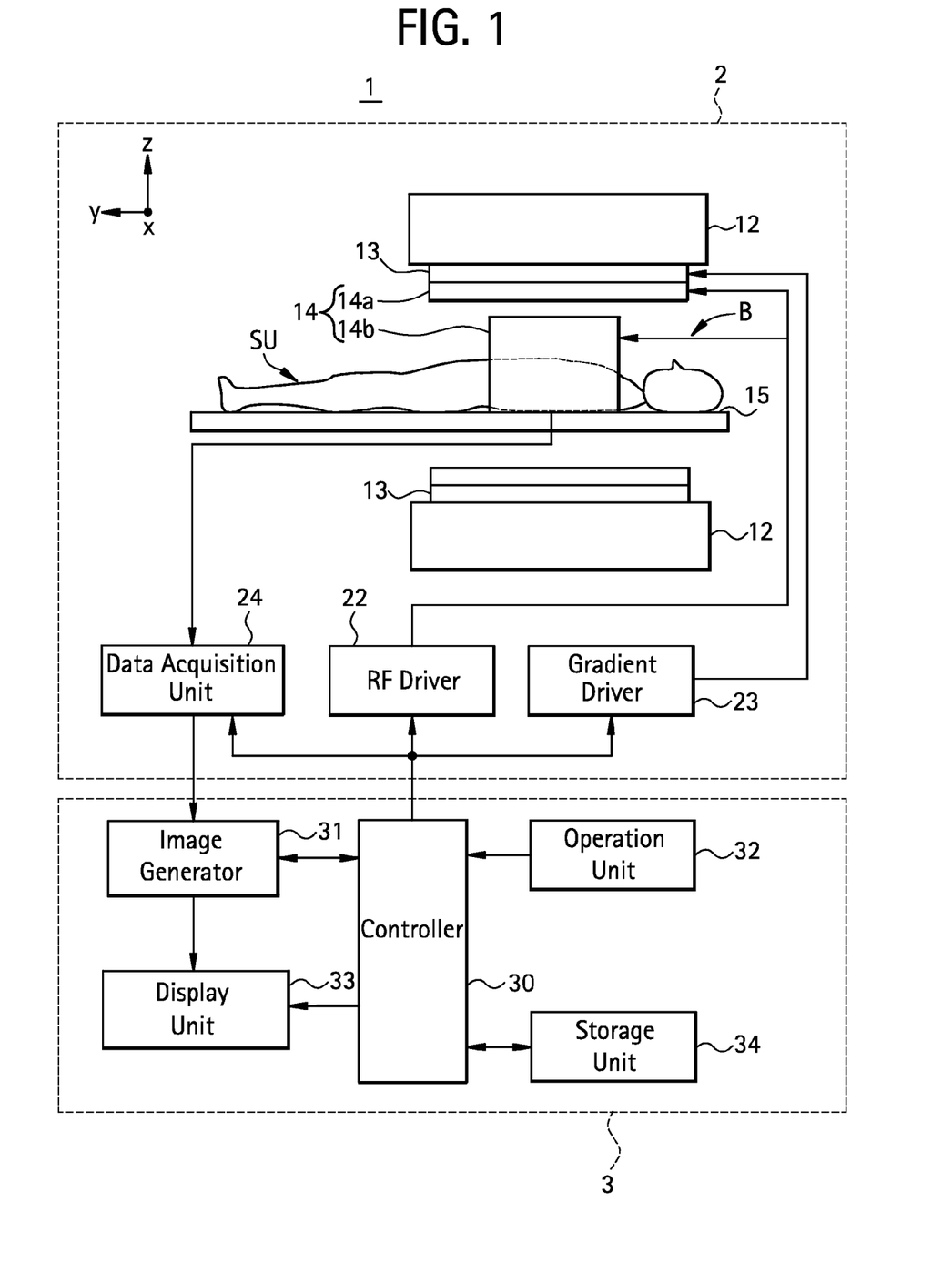
FIG. 1 is a configurational diagram showing a construction of a magnetic resonance imaging apparatus 1 illustrative of an embodiment according to the present invention.

FIG. 1 is a configurational diagram showing a construction of a magnetic resonance imaging apparatus 1 illustrative of the embodiment according to the present invention.

As shown in FIG. 1, the magnetic resonance imaging apparatus 1 showing the present embodiment has a scan section 2 and an operation console section 3.

The scan section 2 will be described.

As shown in FIG. 1, the scan section 2 has a static magnetic field magnet unit 12, a gradient coil unit 13, an RF coil unit or part 14, a cradle 15, an RF driver 22, a gradient driver 23 and a data acquisition unit 24. The scan section 2 executes an actual scan AS for transmitting an RF pulse to a subject SU so as to excite the spin of the subject SU in an imaging space B formed with a static magnetic field and transmitting a gradient pulse to the subject SU to which the RF pulse has been transmitted, thereby obtaining a magnetic resonance signal generated in the subject SU as actual scan data. Further, the scan section 2 executes the actual scan AS and effects a reference scan RS on the subject SU before the execution of the actual scan AS to thereby acquire a magnetic resonance signal generated by the reference scan RS as reference scan data.

Respective constituent elements of the scan section 2 will be explained sequentially.

The static magnetic field magnet unit 12 comprises a superconductive magnet (not shown) and forms a static magnetic field in the imaging space B in which the subject SU is accommodated or held. Here, the static magnetic field magnet unit 12 forms the static magnetic field so as to extend along a body-axis direction (z direction) of the subject SU placed on the cradle 15. Incidentally, the static magnetic field magnet unit 12 may be constituted of a pair of permanent magnets.

The gradient coil unit 13 forms a gradient magnetic field in the imaging space B formed with the static magnetic field and applies or adds spatial position information to the magnetic resonance signal received by the RF coil part 14. Here, the gradient coil unit 13 comprises three systems set so as to correspond to a three-axis direction in which z, x and y directions extending along a static magnetic field direction are orthogonal to one another. These transmit gradient pulses in such a manner that a gradient magnetic field is formed in each of a frequency encode direction, a phase encode direction and a slice selection direction according to an imaging condition. Described specifically, the gradient coil unit 13 applies the gradient magnetic field in the slice selection direction of the subject SU and selects a slice of the subject SU excited by transmission of the RF pulse by the RF coil part 4. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

The RF coil part 14 transmits the RF pulse corresponding to an electromagnetic wave to its corresponding imaging area of the subject SU in the imaging space B formed with the static magnetic field by the static magnetic field magnet unit 12 to form a high frequency magnetic field, thereby exciting the spins of proton in the imaging area of the subject SU. The RF coil part 14 receives an electromagnetic wave generated from the excited proton in the imaging area of the subject SU as a magnetic resonance signal. In the present embodiment, the RF coil part 14 has a first RF coil 14a and a second RF coil 14b as shown in FIG. 1. Here, the first RF coil 14a is of, for example, a bird cage type body coil and disposed so as to surround the imaging area of the subject SU. On the other hand, the second RF coil 14*b* is of a coil uniform in reception sensitivity distribution as compared with the first RF coil 14*a* in its imaging area. The second RF coil 14*b* is a phased array coil and has a plurality of surface coils disposed along the surface of the imaging area of the subject SU.

The cradle 15 has a table that places the subject SU thereon. The cradle 15 moves the table between the inside and outside of the imaging space B, based on a control signal supplied from a controller 30.

The RF driver 22 drives the RF coil part 14 to transmit an RF pulse to within the imaging space B, thereby forming a high frequency magnetic field in the imaging space B. The RF driver 22 modulates a signal sent from an RF oscillator (not shown) to a signal having predetermined timing and predetermined envelope using a gate modulator (not shown) on the basis of the control signal outputted from the controller 30. Thereafter, the RF driver 22 allows an RF power amplifier (not shown) to amplify the signal modulated by the gate modulator and outputs the same to the RF coil part 14 and allows the RF coil part 14 to transmit the RF pulse.

The gradient driver 23 applies a gradient pulse to the gradient coil unit 13 based on the control signal outputted from the controller 30 to drive the gradient coil unit 13, thereby to generate a gradient magnetic field within the imaging space B formed with the static magnetic field. The gradient driver 23 has a three-system drive circuit (not shown) in association with the three-system gradient coil unit 13.

The data acquisition unit 24 acquires a magnetic resonance signal received by the RF coil part 14 based on the control signal outputted from the controller 30. Here, the data acquisition unit 24 phase-detects the magnetic resonance signal received by the RF coil part 14 using a phase detector (not shown) with the output of the RF oscillator (not shown) of the RF driver 22 as a reference signal. Thereafter, the data acquisition unit 24 converts the magnetic resonance signal corresponding to the analog signal into a digital signal by using an A/D converter (not shown) and outputs it therefrom.

The operation console section 3 will be explained.

As shown in FIG. 1, the operation console section 3 has the controller 30, an image generator 31, an operation unit 32, a display or display unit 33 and a storage unit 34.

Respective constituent elements of the operation console section 3 will be described sequentially.

The controller 30 has a computer and a program that allows the computer to execute predetermined data processing and controls respective parts. Here, the controller 30 inputs operation data sent from the operation unit 32 and outputs the control signal to the RF driver 22, gradient driver 23 and data acquisition unit 24 respectively, based on the operation data inputted from the operation unit 32, thereby executing a predetermined scan. Along with it, the controller 30 outputs control signals to the image generator 31, display 33 and storage unit 34 to perform their control.

The image generator 31 has a computer and a program that executes predetermined data processing using the computer. The image generator 31 generates an image, based on the control signal supplied from the controller 30. Here, the image generator 31 uses the magnetic resonance signal obtained by executing a scan by the scan section 2 as row data and reconstructs the image about the subject SU. Then, the image generator 31 outputs the generated image to the display 33.

Figure 2:
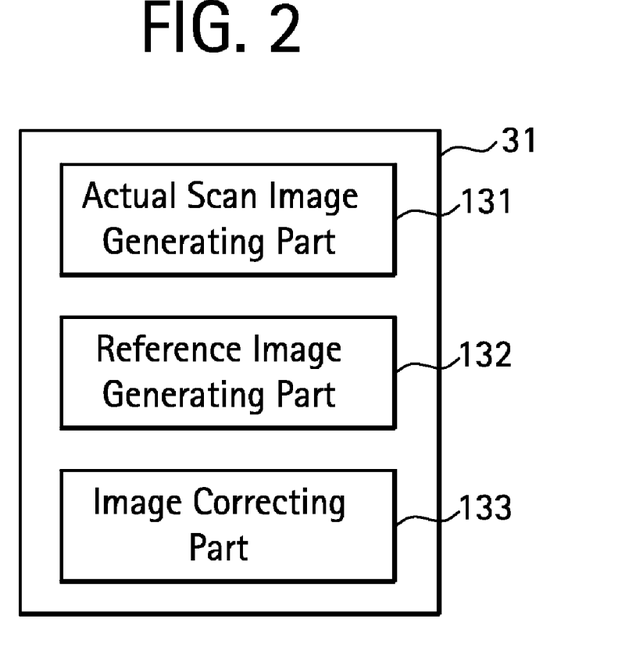
FIG. 2 is a block diagram illustrating an image generator 31 employed in the embodiment according to the present invention.

FIG. 2 is a block diagram showing the image generator 31 employed in the embodiment according to the present invention.

As shown in FIG. 2, the image generator 31 has an actual scan image generating part 131, a reference image generating part 132 and an image correcting part 133.

Here, the actual scan image generating part 131 uses a magnetic resonance signal obtained by performing an actual scan on the imaging area of the subject SU as row data and thereby generates an actual scan image about the imaging area of the subject SU. The reference image generating part 132 uses a magnetic resonance signal obtained by a reference scan executed prior to the actual scan about the imaging area of the subject SU as row data and thereby generates a reference scan image about the imaging area of the subject SU. The image correcting part 133 corrects the actual scan image generated by the actual scan image generating part 131.

Figure 3:
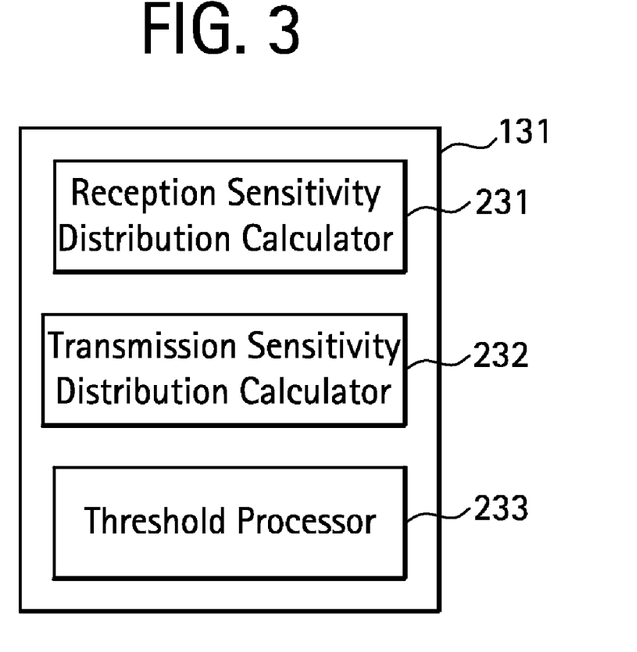
FIG. 3 is a block diagram depicting an image correcting part 133 employed in the embodiment according to the present invention.

FIG. 3 is a block diagram showing the image correcting part 133 employed in the embodiment according to the present invention.

As shown in FIG. 3, the image correcting part 133 has a reception sensitivity distribution calculator 231, a transmission sensitivity distribution calculator 232 and a threshold processor 233. Here, the reception sensitivity distribution calculator 231 calculates a reception sensitivity distribution at the time that the RF coil part 14 receives the magnetic resonance signal therein, in the imaging area of the subject SU. The transmission sensitivity distribution calculator 232 calculates a transmission sensitivity distribution at the time that the RF coil part 14 transmits the RF pulse, in the imaging area of the subject SU. The threshold processor 233 effects threshold processing on the transmission sensitivity distribution calculated by the transmission sensitivity distribution calculator 232. The image correcting part 133 corrects the actual scan image using the reception sensitivity distribution calculated by the reception sensitivity distribution calculator and the transmission sensitivity distribution threshold-processed by the threshold processor 233.

The image generator 31 is constructed as described above.

The operation unit 32 is made up of an operation device such as a keyboard, a pointing device or the like. The operation unit 32 inputs operation data from an operator and outputs the same to the controller 30.

The display 33 is constituted of a display device such as a CRT and displays an image on its display screen, based on the control signal outputted from the controller 30. For example, the display 33 displays images about input items corresponding to the operation data inputted to the operation unit 32 by the operator on the display screen in plural form. Further, the display 33 receives data about the image of the subject SU generated based on the magnetic resonance signal from the subject SU from the image generator 31 and displays the image on the display screen.

The storage unit 34 comprises a memory and stores various data therein. In the storage unit 34, the stored data are accessed by the controller 30 as needed.

(Operation)

A description will be made below of the operation of imaging or photographing the imaging area of the subject SU using the magnetic resonance imaging apparatus 1 showing the embodiment according to the present invention.

Figure 4:
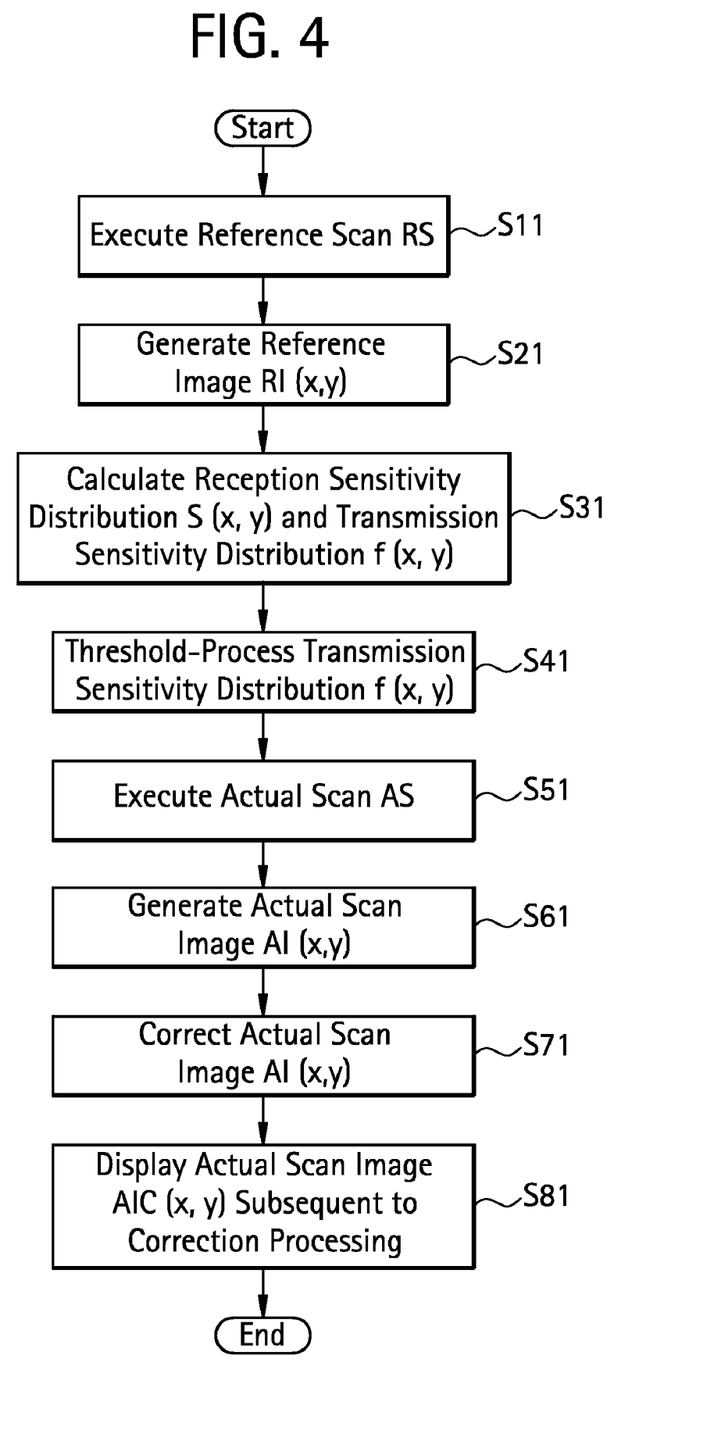
FIG. 4 is a flow chart showing operation executed upon photographing an imaging area of a subject SU in the embodiment of the present invention.
Figure 5:
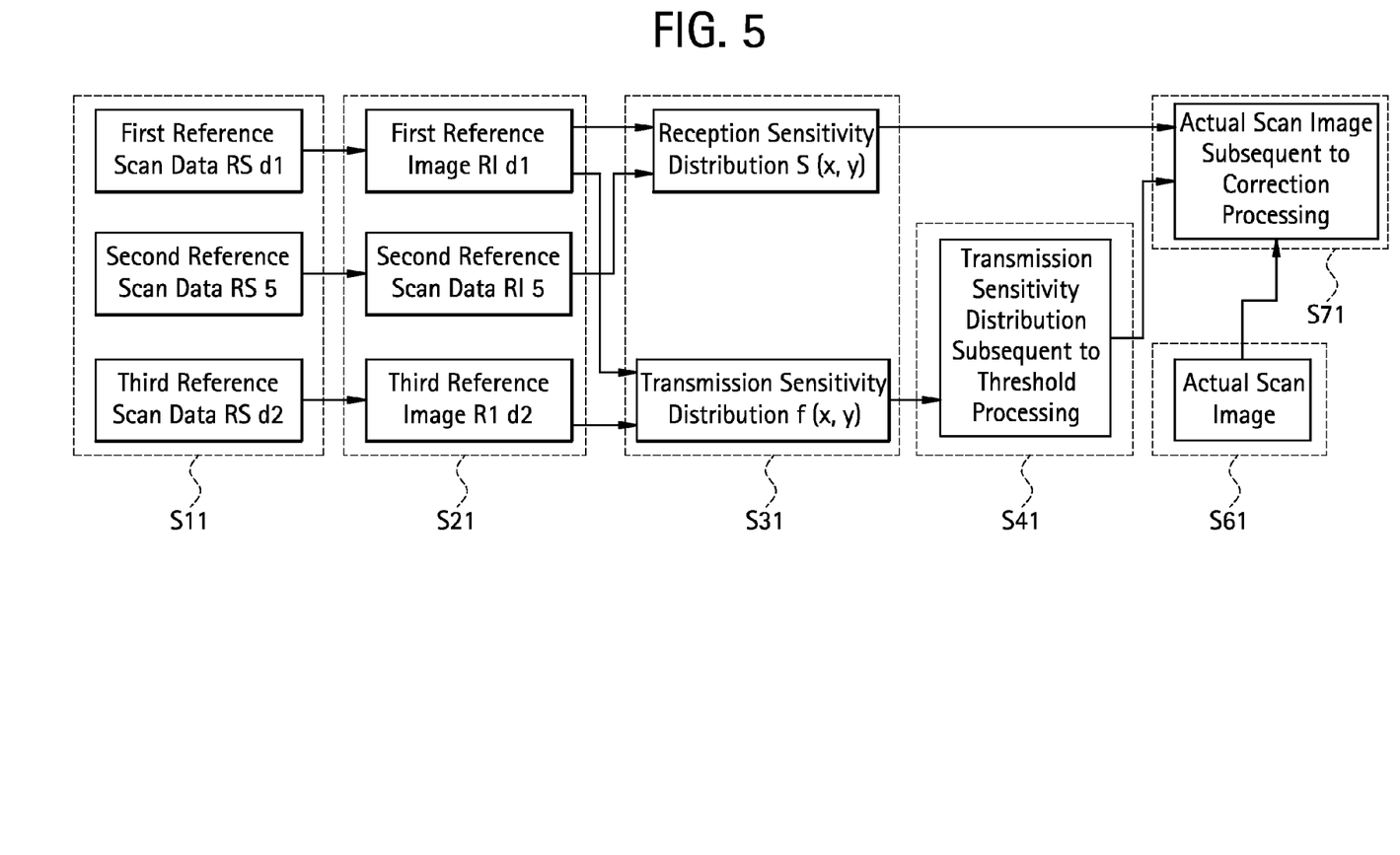
FIG. 5 is a diagram illustrating the flow of data at the time of photography of the imaging area of the subject SU in the embodiment according to the present invention.

FIG. 4 is a flow chart showing the operation of imaging the imaging area of the subject SU in the embodiment according to the present invention. FIG. 5 is a diagram showing the flow of data at the time that the imaging area of the subject SU is photographed in the embodiment according to the present invention.

As shown in FIG. 4, a reference scan RS is first executed (S11).

Here, the scan section 2 executes the reference scan RS for allowing the RF coil part 14 to transmit an RF pulse to the imaging area of the subject SU photographed by the actual scan AS and allowing the RF coil part 14 to receive a magnetic resonance signal generated in the imaging area of the subject SU.

In the present embodiment, the scan section 2 executes a first reference scan RS1, a second reference scan RS2 and a third reference scan RS3 respectively as the reference scan RS. Here, the first reference scan RS1, the second reference scan RS2 and the third reference scan RS3 are respectively executed by a gradient echo method.

Described specifically, the scan section 2 executes the first reference scan RS1 in such a manner that the first RF coil 14*a* corresponding to the body coil transmits an RF pulse of a first flip angle α1 to the imaging area of the subject SU, and the first RF coil 14*a* receives a magnetic resonance signal generated in the imaging area therein. A magnetic resonance signal obtained by the execution of the first reference scan RS1 is acquired as first reference scan data $RS_{\alpha 1}$.

The scan section 2 executes the second reference scan RS2 in such a manner that the first RF coil 14*a* corresponding to the body coil transmits the RF pulse of the first flip angle α1 to the imaging area of the subject SU, and the second RF coil 14*b* corresponding to the phased array coil receives a magnetic resonance signal generated in the imaging area. The magnetic resonance signal obtained by the execution of the second reference scan RS2 is acquired as second reference scan data RSs.

The scan section 2 executes the third reference scan RS3 in such a manner that the first RF coil 14*a* corresponding to the body coil transmits an RF pulse of a second flip angle α2 different from the first flip angle α1 to the imaging area of the subject SU, and the first RF coil 14*a* receives a magnetic resonance signal generated in the imaging area. In the present embodiment, upon execution of the third reference scan RS3, the first RF coil 14*a* transmits the RF pulse to the imaging area in such a manner that the second flip angle α2 reaches one-half of the first flip angle α1. The magnetic resonance signal obtained by the execution of the third reference scan RS3 is acquired as third reference scan data $RS_{\alpha 2}$. Incidentally, since a computational equation can be simplified as expressed in an equation (2) to be described later by setting the second flip angle α2 to one-half of the first flip angle α1, data processing at the calculation of a B1 distribution θ (x, y) can be speeded up.

Thus, the first reference scan data $RS_{\alpha 1}$, the second reference scan data RSs and the third reference scan data $RS_{\alpha 2}$ are respectively acquired in the actual Step (S11) as shown in FIG. 5.

Next, as shown in FIG. 4, the generation of a reference image RI (x, y) is executed (S21).

Here, the reference image generating part 132 generates the reference image RI (x, y) about the imaging area, based on the magnetic resonance signal obtained by the execution of the reference scan RS. In the present embodiment, a first reference image $RI_{\alpha 1}$ (x, y), a second reference image RIs (x, y) and a third reference image $RI_{\alpha 2}$ (x, y) are respectively generated as the reference image RI (x, y).

Described specifically, as shown in FIG. 5, the reference image generating part 132 generates the first reference image $RI_{\alpha 1}$ (x, y) about the imaging area of the subject SU, based on the first reference scan data $RS_{\alpha 1}$ obtained by the execution of the first reference scan RS1.

As shown in FIG. 5, the reference image generating part 132 generates the second reference image RIs (x, y) about the imaging area of the subject SU, based on the second reference scan data RSs obtained by the execution of the second reference scan RS2.

As shown in FIG. 5, the reference image generating part 132 generates the third reference image $RI_{\alpha 2}$ (x, y) about the imaging area of the subject SU, based on the third reference scan data $RS_{\alpha 2}$ obtained by the execution of the third reference scan RS3.

Next, as shown in FIG. 4, the calculation of a reception sensitivity distribution S (x, y) and a transmission sensitivity distribution f (x, y) is carried out (S31).

Here, the reception sensitivity distribution calculator 231 calculates the reception sensitivity distribution S (x, y), based on the first reference image $RI_{\alpha 1}$ (x, y) and the second reference image RIs (x, y) as shown in FIG. 5.

Described specifically, respective pixel data of the first reference image $RI_{\alpha 1}$ (x, y) are divided by respective pixel data of the second reference image RIs (x, y) by means of the reception sensitivity distribution calculator 231 to calculate a reception sensitivity distribution S (x, y) as expressed in the following equation (1):

[Equation 1]

$$s(x, y) = \frac{RI_{\alpha 1}(x, y)}{RI_s(x, y)} \quad (1)$$

On the other hand, as to the transmission sensitivity distribution f (x, y), the transmission sensitivity distribution (transmission sensitivity non-uniformity) f (x, y) developed in the actual scan image generated by the actual scan AS is calculated based on the first reference image $RI_{\alpha 1}$ (x, y) and the third reference image $RI_{\alpha 2}$ (x, y) as shown in FIG. 5. Here, the transmission sensitivity distribution calculator 232 calculates a B1 distribution (flip angle distribution) θ (x, y) using the first reference image $RI_{\alpha 1}$ (x, y) and the third reference image $RI_{\alpha 2}$ (x, y) and thereafter calculates the transmission sensitivity distribution (transmission sensitivity non-uniformity) f(x, y) developed in the actual scan image by the actual scan SA, based on the B1 distribution.

Described specifically, a B1 distribution θ (x, y) about the imaging area of the subject SU is calculated using the first reference image $RI_{\alpha 1}$ (x, y) and the third reference image $RI_{\alpha 2}$ (x, y) as expressed in the following equation (2):

[Equation 2]

$$\theta(x, y) = 2\cos^{-1}\left(\frac{RI_{\alpha 1}(x, y)}{2RI_{\alpha 2}(x, y)}\right) \quad (2)$$

Then, a transmission sensitivity distribution f (x, y) related to an actual scan image generated by executing the actual scan AS in a spin echo sequence is calculated as expressed in the following equation (3):

[Equation 3]

$$f(x, y) = \frac{\alpha}{\theta(x, y)\sin^3\left(\frac{\pi}{2}\frac{\theta(x, y)}{\alpha}\right)} \quad (3)$$

On the other hand, a transmission sensitivity distribution f (x, y) related to an actual scan image generated by executing the actual scan AS in a gradient echo sequence is calculated as expressed in the following equation (4):

[Equation 4]

$$f(x, y)) = \frac{\alpha \sin(\beta)}{\theta(x, y)\sin\left(\beta \frac{\theta(x, y)}{\alpha}\right)} \quad (4)$$

In the above equations (3) and (4), $\alpha$ indicates a flip angle at the time that the first reference scan is carried out, and $\beta$ indicates a flip angle at the time that the actual scan AS is carried out in the gradient echo sequence.

Next, as shown in FIG. 4, threshold processing on the transmission sensitivity distribution f(x, y) is executed (S41).

Here, as shown in FIG. 5, the threshold processor 233 effects threshold processing on the transmission sensitivity distribution f(x, y) calculated by the transmission sensitivity distribution calculator 232 and outputs a transmission sensitivity distribution fh(x, y) subsequent to its threshold processing.

Described specifically, a partial differential value ($\partial f(x, y)/\partial RI_{\alpha 1}(x, y)$) of the transmission sensitivity distribution f(x, y) and the first reference image $RI_{\alpha 1}(x, y)$, and a partial differential value ($\partial f(x, y)/\partial RI_{\alpha 2}(x, Y)$) of the transmission sensitivity distribution f(x, y) and the third reference image $RI_{\alpha 2}(x, y)$ are respectively calculated. Further, a deviation $\sigma RI_{\alpha 1}$ of the first reference image $RI_{\alpha 1}(x, y)$ and a deviation $\sigma RI_{\alpha 2}$ of the third reference image $RI_{\alpha 2}(x, y)$ are calculated.

Thereafter, as expressed in the following equation (5), a partial differential value ($\partial f(x, y)/\partial RI_{\alpha 1}(x, y)$) of the transmission sensitivity distribution f(x, y) and the first reference image $RI_{\alpha 1}(x, y)$, and a partial differential value ($\partial f(x, y)/\partial RI_{\alpha 2}(x, y)$) of the transmission sensitivity distribution f(x, y) and the third reference image $RI_{\alpha 2}(x, y)$ are respectively calculated. Further, a deviation $\sigma_f$ of the transmission sensitivity distribution f(x, y) is calculated using the deviation $\sigma RI_{\alpha 1}$ of the first reference image $RI_{\alpha 1}(x, y)$ and the deviation $\sigma RI_{\alpha 1}$ of the third reference image $RI_{\alpha 2}(x, y)$.

[Equation 5]

$$\sigma_f^2 \left( \frac{\partial f(x, y)}{\partial RI_{\alpha 1}(x, y)} \right)^2 \sigma_{RI\alpha 1}^2 + \left( \frac{\partial f(x, y)}{\partial RI_{\alpha 2}(x, y)} \right)^2 \sigma_{RI\alpha 2}^2 \quad (5)$$

Figure 6:
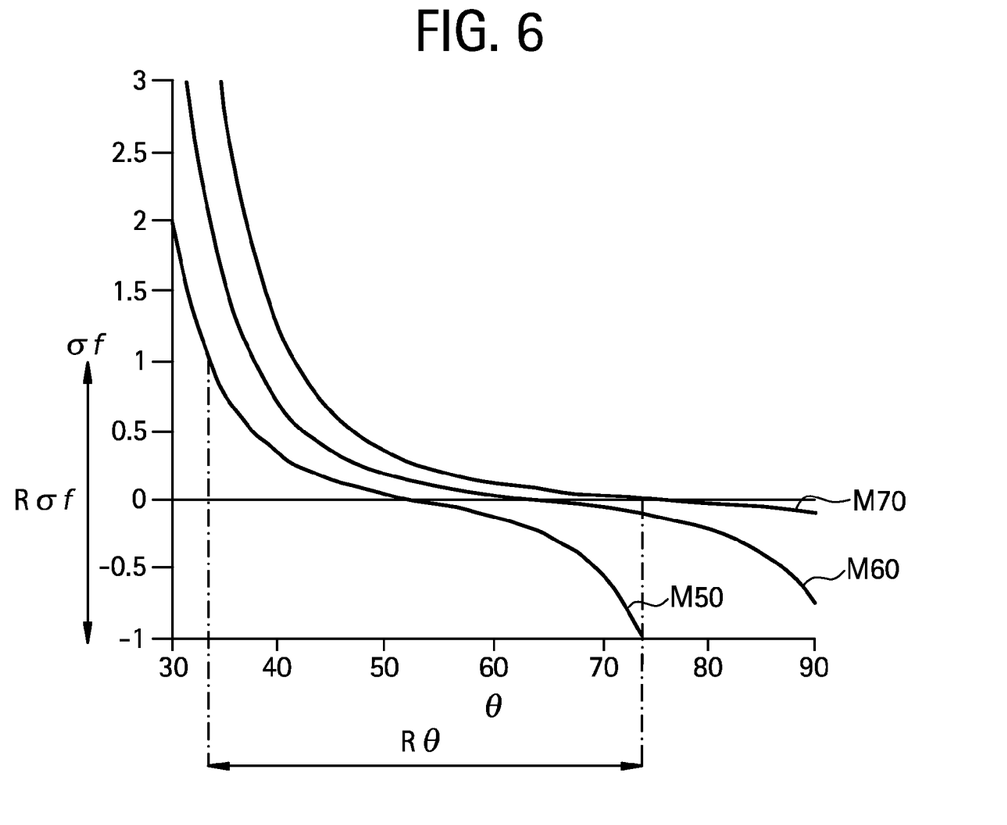
FIG. 6 is a diagram showing the relationship between a deviation $\sigma_f$ of a transmission sensitivity distribution f(x, y) and an actually measured distribution of flip angles θ in the embodiment according to the present invention.

FIG. 6 is a diagram showing the relationship between a deviation $\sigma_f$ of a transmission sensitivity distribution f(x, y) and an actually measured distribution of flip angles $\theta$ in the embodiment according to the present invention. When predetermined flip angles are set, the relationship between the actually measured distribution of flip angles $\theta$ and the deviation $\sigma_f$ of the transmission sensitivity distribution f(x, y) is shown in FIG. 6. Here, results obtained at the time that the flip angles are set as 50°, 60° and 70° are illustrated as M50, M60 and M70 respectively.

A range R$\theta$ of flip angles $\theta$ corresponding to a deviation range $R_{\sigma f}$ set in advance at the deviation $\sigma_f$ of the transmission sensitivity distribution f(x, y) is calculated from the relationship between the deviation $\sigma_f$ of the transmission sensitivity distribution f(x, y) calculated as shown in FIG. 6 and the actually measured distribution of flip angles $\theta$. When the pre-set deviation range $R_{\sigma f}$ ranges from −1.0 to 1.0 upon setting the flip angle to 50° as shown in FIG. 6 by way of example, it is determined that the range R$\theta$ of the flip angles $\theta$ corresponding to it extends from 33° to 75°.

A range Rf of a transmission sensitivity distribution f(x, y) associated with the determined range R$\theta$ of flip angles $\theta$ is determined using the equations (3) and (4), and the range thereof is set as a threshold value.

Thereafter, the transmission sensitivity distribution f(x, y) is threshold-processed using the set threshold value, and a transmission sensitivity distribution fh(x, y) subsequent to the threshold processing is outputted. That is, data lying within a range corresponding to the threshold values at the transmission sensitivity distribution f(x, y) is outputted as the transmission sensitivity distribution fh(x, y) subsequent to the threshold processing. By executing the threshold processing in this way, a portion large in deviation at the transmission sensitivity distribution f(x, y) is removed and the transmission sensitivity distribution is processed within a small deviation range.

Incidentally, since the portion removed or taken out by the threshold processing is indefinite in transmission sensitivity distribution, data is extrapolated by a local polynomial approximation using the values of portions close to one another at the transmission sensitivity distribution fh(x, y). The extrapolated data is processed by a low-pass filter.

The execution of the actual scan AS is next made as shown in FIG. 4 (S51).

Here, the RF coil part 14 transmits an RF pulse to the imaging area of the subject SU in the imaging space B formed with the static magnetic field and receives a magnetic resonance signal generated in the imaging area to which the RF pulse has been transmitted, as actual scan data, whereby the actual scan AS is executed. The actual scan AS is carried out in accordance with, for example, a pulse sequence such as the spin echo sequence or gradient echo sequence.

Next, the generation of an actual scan image AI (x, y) is done as shown in FIG. 4 (S61).

Here, the magnetic resonance signal obtained as the actual scan data by the execution of the actual scan AS is set as row data, and the actual scan image AI (x, y) about its imaging area is generated by the actual scan image generating part 131.

As shown in FIG. 4, the actual scan image AI (x, y) is next corrected (S71).

Here, as shown in FIG. 5, the image correcting part 133 performs correction processing on the actual scan image AI (x, y) generated by the actual scan image generating part 131, using the reception sensitivity distribution S (x, y) and the transmission sensitivity distribution fh (x, y) subsequent to the threshold processing.

Described specifically, as expressed in the following equation (6), the reception sensitivity distribution S (x, y) and the transmission sensitivity distribution fh (x, y) subsequent to the threshold processing are respectively integrated or accumulated with respect to the actual scan image AI (x, y) for every pixel of each individual position as viewed in x and y directions at the actual scan image AI (x, y), whereby an actual scan image AIc (x, y) subsequent to the correction processing is generated.

[Equation 6]

$$AI_c(x,y) = AI(x,y) \times fh(x,y) \times s(x,y) \quad (6)$$

Next, as shown in FIG. 4, the actual scan image AIc (x, y) subsequent to the correction processing is displayed (S81).

Here, the display 33 displays the actual scan image AIc (x, y) subsequent to being correction-processed by the image correcting part 133 on its display screen.

In the present embodiment as described above, the reception sensitivity distribution calculator 231 calculates a reception sensitivity distribution S (x, y). Along with it, the transmission sensitivity distribution calculator 232 calculates a transmission sensitivity distribution f (x, y) in accordance with a double flip angle method. Next, the threshold processor 233 threshold-processes the calculated transmission sensitivity distribution f (x, y). Here, the threshold processor 233 determines a range small in deviation at the transmission sensitivity distribution f (x, y) by threshold processing and outputs its range as a transmission sensitivity distribution fh (x, y) subsequent to the threshold processing. Further, the image correcting part 131 corrects an actual scan image AI (x, y) using the post-threshold processing transmission sensitivity distribution fh (x, y).

Figure 7A:
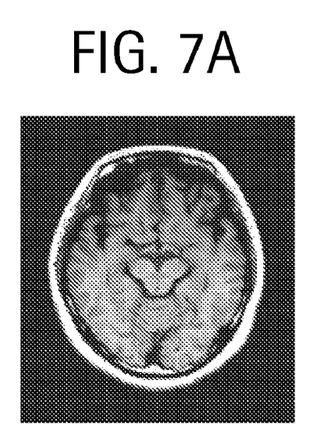
FIGS. 7a, 7b, and 7c are actual scan images obtained with respect to the imaging area of the subject SU in the embodiment according to the present invention.
Figure 7B:
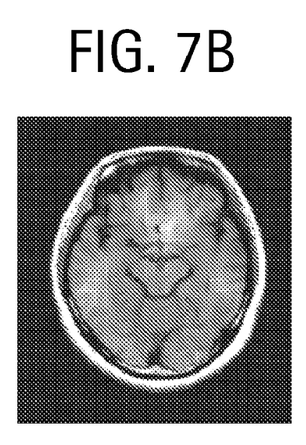
Figure 7C:
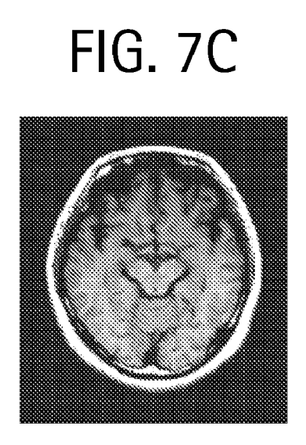

FIG. 7 is a diagram showing actual scan images obtained with respect to the imaging area of the subject SU in the embodiment according to the present invention. In FIG. 7, FIG. 7(a) is an actual scan image prior to correction processing. FIG. 7(b) is an actual scan image about the imaging area of the subject SU correction-processed using a transmission sensitivity distribution f (x, y) not subjected to threshold processing. FIG. 7(c) is an actual scan image about the imaging area of the subject SU correction-processed using a transmission sensitivity distribution fh (x, y) subsequent to the threshold processing in the present embodiment.

When the actual scan image is correction-processed using the transmission sensitivity distribution f (x, y) not subjected to the threshold processing as shown in FIGS. 7(a) and 7(b), artifacts occur. When, however, the actual scan image is correction-processed using the transmission sensitivity distribution fh (x, y) subjected to the threshold processing as shown in FIGS. 7(a) and 7(c) in the present embodiment, no artifacts occur.

Thus, in the present embodiment, the portion large in deviation and low in accuracy at the transmission sensitivity distribution f (x, y) is eliminated by the threshold processing, whereby the transmission sensitivity distribution fh (x, y) constituted of the portion small in deviation and obtained with high accuracy is determined, and the actual scan image RI (x, y) is correction-processed using the transmission sensitivity distribution fh (x, y) subsequent to the threshold processing. It is therefore possible to prevent the occurrence of artifacts in the image. That is, since the sensitivity correction is carried out using only the data of the region or portion high in measuring reliability in consideration of the gain of noise in the present embodiment, the occurrence of the artifacts can be suppressed and image quality can easily be enhanced.

Incidentally, the magnetic resonance imaging apparatus 1 according to the above embodiment is equivalent to the magnetic resonance imaging apparatus of the present invention. The scan section 2 of the above embodiment corresponds to the reference scan execution section of the present invention. The RF coil part 14 of the above embodiment corresponds to the RF coil unit of the present invention. The first RF coil 14a of the above embodiment corresponds to the first RF coil of the present invention. The second RF coil 14b of the above embodiment corresponds to the second RF coil of the present invention. The display 33 of the above embodiment corresponds to the display unit of the present invention. The reference image generating part 132 of the above embodiment corresponds to the reference image generating unit of the present invention. The image correcting part 133 of the above embodiment corresponds to the image correcting unit of the present invention. The reception sensitivity distribution calculator 231 of the above embodiment corresponds to the reception sensitivity distribution calculating part of the present invention. The transmission sensitivity distribution calculator 233 of the above embodiment corresponds to the transmission sensitivity distribution calculating part of the present invention. The threshold processor 233 of the above embodiment corresponds to the threshold processing part of the present invention. The imaging space B of the above embodiment corresponds to the static magnetic field space of the present invention.

Upon implementation of the present invention, the present invention is not limited to the above embodiment. Various modifications can be adopted.

Although, for example, the threshold value is set based on the deviation of the first reference image and the deviation of the third reference image and the threshold processing is executed in the above embodiment, the present invention is not limited to it. For example, the range for the B1 values or flip angle values may be set as the threshold value in advance to carry out the threshold processing without calculating the deviation of the first reference image and the deviation of the third reference image.

Although the range $R\theta$ of the flip angles $\theta$ corresponding to the deviation range $R_{\sigma f}$ set in advance at the deviation $\sigma_f$ of the transmission sensitivity distribution $f(x, y)$ is calculated from the relationship between the deviation $\sigma_f$ of the transmission sensitivity distribution $f(x, y)$ and the actually measured distribution of flip angles $\theta$, the present invention is not limited to it. For example, the deviation range $R_{\sigma f}$ is determined so as to correspond to scan parameters inputted to the operation unit 32. Afterwards, the range $R\theta$ for the flip angles $\theta$, corresponding to the determined deviation range $R_{\sigma f}$ may be calculated.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging apparatus configured to execute an actual scan in which an RF coil unit transmits an RF pulse to an imaging area of a subject in a static magnetic field space and receives a magnetic resonance signal generated in the imaging area in response to the RF pulse, said magnetic resonance imaging apparatus further configured to generate an actual scan image of the imaging area based on the magnetic resonance signal acquired by the execution of the actual scan, said magnetic resonance imaging apparatus comprising:
    an image correcting unit configured to correct the actual scan image, said image correcting unit comprises:
        a transmission sensitivity distribution calculating part configured to calculate a transmission sensitivity distribution at the time that said RF coil unit transmits the RF pulse to the imaging area; and
        a threshold processing part configured to threshold-process the transmission sensitivity distribution calculated by said transmission sensitivity distribution calculating part, said image correcting unit configured to correct the actual scan image using the threshold-processed transmission sensitivity distribution.

2. The magnetic resonance imaging apparatus according to claim 1, wherein said image correcting unit further comprises a reception sensitivity distribution calculating part configured to calculate a reception sensitivity distribution at the time that said RF coil unit receives the magnetic resonance signal from the imaging area, wherein said image correcting unit is configured to correct the actual scan image using the reception sensitivity distribution calculated by said reception sensitivity distribution calculating part.

3. The magnetic resonance imaging apparatus according to claim 2, wherein said RF coil comprises a first RF coil having a first reception sensitivity distribution and a second RF coil having a second reception sensitivity distribution different than the first reception sensitivity distribution, said magnetic resonance imaging apparatus further comprising:

a reference scan execution section configured to execute a reference scan prior to the execution of the actual scan, wherein the reference scan includes:

a first reference scan to which said first RF coil transmits a first reference RF pulse to the imaging area at a first flip angle and receives a magnetic resonance signal generated in the imaging area in response to the first reference RF pulse;

a second reference scan to which said first RF coil transmits a second reference RF pulse to the imaging area at the first flip angle and said second RF coil receives a magnetic resonance signal generated in the imaging area in response to the second reference RF pulse; and a third reference scan to which said first RF coil transmits a third reference RF pulse to the imaging area at a second flip angle different from the first flip angle and receives a magnetic resonance signal generated in the imaging area in response to the third reference RF pulse; and a reference image generating unit is configured to generate a first reference image based on the magnetic resonance signal obtained by the execution of the first reference scan, a second reference image based on the magnetic resonance signal obtained by the execution of the second reference scan, and a third reference image based on the magnetic resonance signal obtained by the execution of the third reference scan, wherein said reception sensitivity distribution calculating part is configured to calculate the reception sensitivity distribution based on the first reference image and the second reference image, and wherein said transmission sensitivity distribution calculating part is configured to calculate the transmission sensitivity distribution based on the first reference image and the third reference image.

4. The magnetic resonance imaging apparatus according to claim 3, wherein said threshold processing part is configured to set a threshold value based on a deviation of the first reference image and a deviation of the third reference image and to execute the threshold processing using the set threshold value.

5. The magnetic resonance imaging apparatus according to claim 4, wherein said reference scan execution section is configured to enable said first RF coil to transmit an RF pulse to the imaging area upon execution of the third reference scan such that the second flip angle reaches one-half of the first flip angle.

6. The magnetic resonance imaging apparatus according to claim 5, wherein said reference scan execution section is configured to execute the first reference scan, the second reference scan, and the third reference scan respectively using a gradient echo method.

7. The magnetic resonance imaging apparatus according to claim 3, wherein said first RF coil comprises a body coil, and said second RF coil comprises a phased array coil.

8. The magnetic resonance imaging apparatus according to claim 1, further comprising a display unit configured to display the actual scan image corrected by said image correcting unit.

9. A magnetic resonance imaging method comprising:

executing an actual scan in which an RF coil unit transmits an RF pulse to an imaging area of a subject in a static magnetic field space and receives a magnetic resonance signal generated in the imaging area to which the RF pulse is transmitted;

generating an actual scan image of the imaging area based on the magnetic resonance signal acquired by the execution of the actual scan;

calculating a transmission sensitivity distribution at the time that the RF coil unit transmits the RF pulse to the imaging area;

threshold-processing the calculated transmission sensitivity distribution; and correcting the actual scan image the threshold-processed transmission sensitivity distribution.

10. The magnetic resonance imaging method according to claim 9, wherein correcting the actual scan image comprises calculating a reception sensitivity distribution at the time that the RF coil unit receives the magnetic resonance signal from the imaging area, wherein the actual scan image is corrected using the calculated reception sensitivity distribution.

11. The magnetic resonance imaging method according to claim 10, wherein the RF coil includes a first RF coil having a first reception sensitivity distribution and a second RF coil having a second reception sensitivity distribution different than the first reception sensitivity distribution, said method further comprising:

executing a reference scan prior to the actual scan, the reference scan including a first reference scan in which the first RF coil transmits a first reference RF pulse to the imaging area at a first flip angle and receives a magnetic resonance signal generated in the imaging area in response to the first reference RF pulse, a second reference scan in which the first RF coil transmits a second reference RF pulse to the imaging area at the first flip angle and the second RF coil receives a magnetic resonance signal generated in the imaging area in response to the second reference RF pulse, and a third reference scan in which the first RF coil transmits a third reference RF pulse to the imaging area at a second flip angle different from the first flip angle and receives a magnetic resonance signal generated in the imaging area in response to the third reference RF pulse;

generating a first reference image based on the magnetic resonance signal obtained by the execution of the first reference scan;

generating a second reference image based on the magnetic resonance signal obtained by the execution of the second reference scan; and generating a third reference image based on the magnetic resonance signal obtained by the execution of the third reference scan, wherein the reception sensitivity distribution is calculated based on the first reference image and the second reference image, and wherein the transmission sensitivity distribution is calculated based on the first reference image and the third reference image.

12. The magnetic resonance imaging method according to claim 11, wherein threshold-processing the calculated transmission sensitivity distribution comprises setting a threshold value based on a noise component of the first reference image and a noise component of the third reference image and threshold-processing the calculated transmission sensitivity distribution using the set threshold value.

13. The magnetic resonance imaging method according to claim 12, wherein executing a reference scan comprises during the third reference scan transmitting an RF pulse to the imaging area such that the second flip angle reaches one-half of the first flip angle.

14. The magnetic resonance imaging method according to claim 13, wherein executing a reference scan comprises executing the first reference scan, the second reference scan, and the third reference scan using a gradient echo method.

15. The magnetic resonance imaging method according to claim 11, wherein executing a reference scan comprises executing a reference scan with the first RF coil being a body coil and the second RF coil being a surface coil.

16. The magnetic resonance imaging method according to claim 9, further comprising displaying the corrected actual scan.

17. A method for reducing imaging artifacts using a Magnetic Resonance Imaging apparatus, said method comprising:
  performing a plurality of reference scans to generate a plurality of reference images;
  calculating a reception sensitivity distribution using at least two of the reference images;
  calculating a transmission sensitivity distribution using at least two of the reference images;
  performing an actual scan to generate an actual scan image; and
  processing the actual scan image using the reception sensitivity distribution and the transmission sensitivity distribution to reduce imaging artifacts in the actual scan image.

18. A method in accordance with claim 17 wherein performing a plurality of reference scans further comprises:
  performing a first reference scan to generate a first reference image;
  performing a second reference scan to generate a second reference image; and
  performing a third reference scan to generate a third reference image.

19. A method in accordance with claim 18 further comprising:
  calculating the reception sensitivity distribution using the first and second reference images; and
  calculating a first transmission sensitivity distribution using the first and third reference images.

20. A method in accordance with claim 19, further comprising:
  threshold processing the first transmission distribution to generate a second transmission sensitivity distribution; and
  processing the actual scan image using the reception sensitivity distribution and the second transmission sensitivity distribution to reduce imaging artifacts.

* * * * *